(12) United States Patent
Boireau

(10) Patent No.: US 6,734,555 B2
(45) Date of Patent: May 11, 2004

(54) INTEGRATED CIRCUIT PACKAGE AND PRINTED CIRCUIT BOARD ARRANGEMENT

(75) Inventor: Olivier Boireau, Birmingham (GB)

(73) Assignee: Sendo International Limited, Hong Kong (HK)

( * ) Notice: Subject to any disclaimer, the term of this patent is extended or adjusted under 35 U.S.C. 154(b) by 25 days.

(21) Appl. No.: 10/065,016

(22) Filed: Sep. 10, 2002

(65) Prior Publication Data

US 2003/0047349 A1 Mar. 13, 2003

(30) Foreign Application Priority Data

Sep. 11, 2001 (GB) .............................................. 0121891

(51) Int. Cl.⁷ .............................................. H01L 23/48
(52) U.S. Cl. ........................ 257/734; 257/786; 257/690; 174/260
(58) Field of Search ................................ 257/734, 786, 257/690; 174/260

(56) References Cited

U.S. PATENT DOCUMENTS

| | | | | |
|---|---|---|---|---|
| 4,707,162 A | * | 11/1987 | Brookes | 361/306 |
| 4,994,902 A | | 2/1991 | Okahashi et al. | |
| 5,126,828 A | | 6/1992 | Hatta | |
| 5,717,245 A | * | 2/1998 | Pedder | 257/691 |
| 5,923,540 A | | 7/1999 | Asada | |
| 6,057,600 A | * | 5/2000 | Kitazawa et al. | 257/728 |
| 6,107,685 A | * | 8/2000 | Nishiyama | 257/737 |
| 6,144,091 A | | 11/2000 | Washida | |
| 6,265,783 B1 | * | 7/2001 | Juso et al. | 257/786 |
| 6,403,896 B1 | * | 6/2002 | Ma et al. | 174/261 |
| 6,448,639 B1 | * | 9/2002 | Ma | 257/691 |
| 6,479,758 B1 | * | 11/2002 | Arima et al. | 174/260 |
| 6,504,104 B2 | * | 1/2003 | Hacke et al. | 174/254 |
| 6,512,680 B2 | * | 1/2003 | Harada et al. | 361/777 |
| 6,531,769 B2 | * | 3/2003 | Yamaguchi | 257/692 |

FOREIGN PATENT DOCUMENTS

| | | |
|---|---|---|
| EP | 0 517 247 | 6/1992 |
| GB | 2301937 | 12/1996 |
| GB | 2344463 | 6/2000 |
| WO | WO 99/60627 | 11/1999 |

* cited by examiner

Primary Examiner—Kamand Cuneo
Assistant Examiner—Lourdes Cruz
(74) Attorney, Agent, or Firm—McGarry Bair PC

(57) ABSTRACT

An integrated circuit package device (100, 200, 300) has a plurality of contact points including an inner portion of contact points (120) and an outer portion of contact points (110). The integrated circuit package device includes at least one of the following: (i) one or more power supply contacts (130) configured substantially in said outer portion; (ii) one or more ground contacts (220, 230) configured substantially in said inner portion; (iii) one or more timing or frequency contacts (140) substantially in said outer portion; (iv) one or more data or high speed signal contacts (310) configured substantially in said outer portion of said integrated circuit package device. This provides the advantage that the required capacitors can be located as close to the power supply contacts as possible, and the tracking to these contacts can be kept to a minimum. Furthermore by providing the ground contacts toward the inner portion of the integrated circuit package device, the need for the other contacts to be routed around the ground contacts and any related vias is avoided.

14 Claims, 2 Drawing Sheets

INTEGRATED CIRCUIT PACKAGE AND PRINTED CIRCUIT BOARD ARRANGEMENT

CROSS REFERENCE TO RELATED APPLICATIONS

This application claims priority on British Patent Application GB 01 21891.6 filed Sep. 11, 2001.

BACKGROUND OF INVENTION

1. Field of the Invention

The present invention relates to an integrated circuit package and circuit board arrangement. The invention is applicable to, but not limited to, a contact layout arrangement for integrated circuit packaging.

2. Background of the Invention

Most, if not all, current electrical and electronic equipment uses printed circuit board (PCB) technology to operably couple electronic components together. A typical printed circuit board includes a large number of metalised tracks to facilitate the operable coupling of components.

Such components typically have a plurality of contact points, such as input/output ports, power supply points, ground points, clock signal input/output ports, etc., to interface to other components. In recent times, the complexity of such electronic components and circuits has increased dramatically, to the point now where many electronic components and functions are performed in single or multiple integrated circuit packages.

An integrated circuit (IC) is a complete circuit that is manufactured as a single package. The IC may consist of several separate component parts attached by a ceramic substrate and interconnected by wire bonds or a suitable metalisation pattern. The complexity of circuits being produced on a single chip has been increasing rapidly, where very large scale integration (VLSI) and extra large-scale integration (ELSI) having hundreds of thousands of logic gates on a single chip are becoming commonplace.

Consequently, printed circuit boards have become more complex to design, to facilitate the increase in the number of tracks to link to the various component parts of the IC. As such, in the main, printed circuit boards have evolved to multi-layer arrangements, where each layer contains many tracks. The individual layers are operably connected at strategically designed points using vias, which are metallic connections that link two or more layers in a multi-layer substrate.

In the field of this invention it is known that integrated circuit (IC) packaging has evolved to the situation where each IC package requires a large number of different types of contacts, for example ground contacts, power supply contacts, oscillator/clock contacts, data and other high speed contacts etc.

The inventor of the present invention has identified problems encountered when attempting to route tracks to/from the contacts of IC packaging. These problems are often caused by the particular layout of the contacts of the IC package.

A first problem encountered relates to the power supply contacts of the IC package. As known in the art, power supply contacts require large de-coupling capacitors connected thereto. If a long track is provided between the capacitor and its corresponding power supply contact, the track acts as a resistor. The combination of the capacitance with the induced resistance effectively creates a filtering effect on the power supply signal input to the power supply contact on the IC package. The longer a track to the contact point, the greater is the resistance induced by the track. In this manner, by having a resistance between the capacitor and the power supply contact, the ability for current to flow between the resistor and the power supply contact is reduced. Hence, it is important to provide the shortest amount of track between the capacitor and the power supply contact.

Furthermore, because of the potentially high amount of current that can flow through power supply contacts and tracks, the tracks need to be relatively wide. Therefore, it is also preferable to keep the tracks as short as possible in order to reduce costs and reduce the amount of area on the PCB taken up by such power supply tracks.

A second problem encountered relates to ground connections of IC packages. The problem recognized by the inventor of the present invention relates to the connecting of ground points, contacts and/or layers of an IC package using the aforementioned vias (sometimes termed through-holes), which pass through several layers of a PCB. For electronic devices such as mobile phones, the ground layer is often extended to substantially the entire length and width of the PCB, and designed to act as a shield between radio frequency (RF) circuitry and baseband circuitry. Because of this, baseband circuitry is often arranged to be on the opposite side of the ground-plane (or layer) to the RF circuits/components. Thus, such vias often provide obstructions when trying to route tracks around the PCB.

A third problem encountered arises from the need to connect timing or frequency contacts to oscillator or clock generation circuits, which are used by the IC to provide clock signals etc. These contacts are required to be connected to oscillators, such as quartz, and decoupling capacitors. If tracks used to connect to such components are again too long, parasitic capacitance and induced resistance become significant enough to affect the oscillating signal frequency, and thereby the resulting clock signal(s).

Thus, in order for clock signals to be as accurate as possible, the required components are preferably located as close to the integrated circuit package contacts as possible. Furthermore, clock signals on devices such as mobile phones are prone to interference caused by RF signals. Although the ground layer is often provided between baseband circuitry and RF circuitry, vias and other inter-layer connections can cause apertures in the ground layer, which facilitate the propagation of RF interference.

A need therefore exists for an improved integrated circuit and printed circuit board arrangement, and, in particular, an improved contact layout configuration for an integrated circuit, wherein the abovementioned disadvantages may be alleviated.

SUMMARY OF INVENTION

In accordance with the invention, an arrangement of a plurality of contact points is provided in an integrated circuit package device or a printed circuit board. The plurality of contact points includes an inner portion of the contact points and an outer portion of the contact points, and at least one of the following:

(i) a majority of power supply contacts is configured substantially in an extremity of the outer portion;

(ii) a majority of timing or frequency contacts is configured substantially in the outer portion; and (iii) a majority of data or high speed signal contacts is configured substantially in an inner side of the outer portion.

In one aspect of the invention, the arrangement is provided in an integrated circuit package device. In another aspect of the invention, the arrangement is provided in a printed circuit board having a plurality of tracks for operably coupling electrical signals to the plurality of contact points.

Preferably, ground contacts are further provided along a bisectional axis through the outer portion to facilitate a ground path from outside an area of either the integrated circuit package device or the PCB to the inner portion. The inner portion can be farmed substantially of ground contact points to effect a ground plane. Also, the inner portion and the outer portion are preferably two distinct regions separated by a space.

Further aspects of the invention are as claimed in the dependent claims.

In summary, the present invention proposes inter-alia, to arrange the positioning of an IC package's interface ports/contact points to facilitate an easier, more accurate and more reliable printed circuit board layout.

BRIEF DESCRIPTION OF DRAWINGS

Exemplary embodiments of the present invention will now be described, with reference to the accompanying drawings that illustrate preferred contact layouts for integrated circuit packages etc., in which.

DETAILED DESCRIPTION

Figure 1:
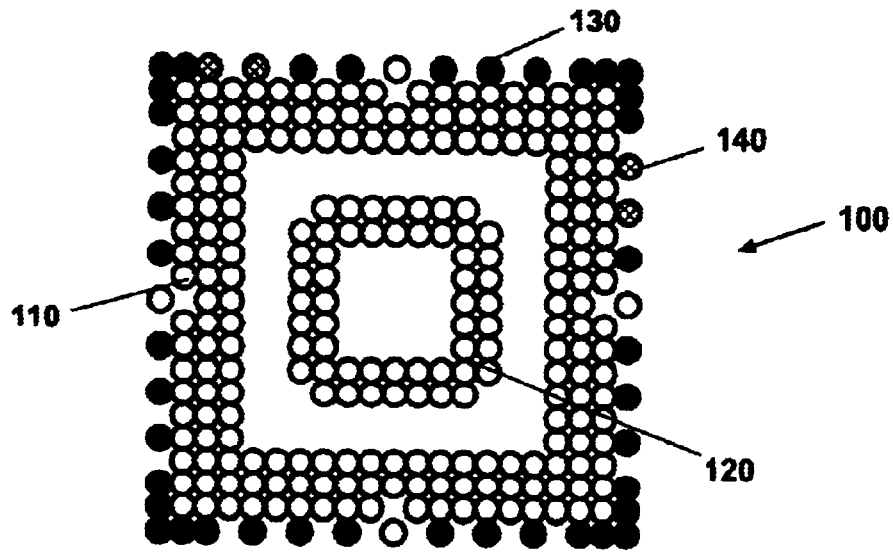
FIG. 1 shows an IC package contact layout illustrating a positioning of power supply contacts and clock generation contacts, in accordance with the preferred embodiment of the present invention.

Referring first to FIG. 1, an IC package contact layout 100, illustrating a preferred positioning of power supply contacts 130 and clock generation contacts 140, is shown. The IC package layout of the preferred embodiment of the present invention includes an inner portion of contacts 120 and an outer portion of contacts 110.

The power supply contacts 130 are shown on the extremities of the outer portion of the IC package, illustrated as solid black circles. By selecting the extremities of the outer portion of an IC package as power supply contacts; shorter track paths from the power supply of the electronic device to the power supply contact point(s) of the IC package are achieved.

In addition, if required, clock generation contacts 140 are shown on the extremities of the outer portion of the IC package, illustrated as hashed circles. Similarly, this enables shorter track paths from the clock generation component(s) of the electronic device to the clock/timing contact point(s) of the IC package.

This topography allows the power supply contact(s) to be located as close as possible to its/their associated de-coupling capacitor(s), thereby minimizing the track resistance introduced to the circuit. Beneficially, the area on the PCB taken up by the tracks to the power supply contact(s) is also minimized.

Furthermore, this topography allows the required clock generation components to be as close to the relevant clock/timing contact point(s) as possible. Hence, undesired parasitic capacitance and resistance due to the length of track(s) between the clock or frequency generator components and the clock/timing contact point(s) are minimized to avoid affecting the timing signal(s). In addition, it enables the required clock signal tracks to be designed on the uppermost layer of the printed circuit board, thereby minimizing any effect of interference from say RF circuits and components.

Figure 2:
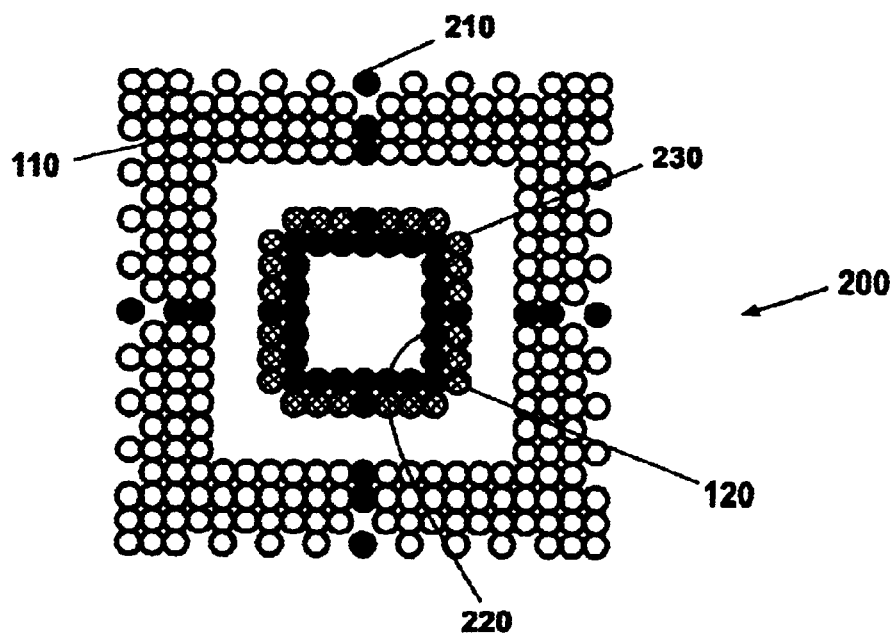
FIG. 2 shows an IC package contact layout illustrating positioning of ground contacts, in accordance with the preferred embodiment of the present invention.

Referring now to FIG. 2, an IC package contact layout 200 illustrates a positioning of ground contacts in accordance with the preferred embodiment of the present invention.

Again, the IC package layout of the preferred embodiment of the present invention includes an inner portion of contacts 120 and an outer portion of contacts 110. The preferred positioning of the ground contacts are illustrated as solid black circles 220 on the inner portion of the IC package layout 200.

Hence, the preferred embodiment of the present invention provides the ground contacts of the integrated circuit package substantially towards the center of the integrated circuit package. In this manner, the need for other contacts of the integrated circuit package to have to be routed around the ground contacts and their related vias is minimized. This topography is of significant benefit in the circuit layout design of baseband circuitry, which, with the above ground contacts, can now be more readily positioned distal from the RF circuitry.

However, the inventor of the present invention has recognized a potential problem with such a ground contact layout. It may be possible that a particular topography would generate a floating ground layer, whereby the region of the ground layer, to which the ground contacts are connected, becomes substantially isolated from the rest of the ground layer. Such a problem may emanate by vias being cut into the ground layer in a ring or loop fashion. The area of the ground plane within this ring or loop is then effectively isolated from the area outside the ring or loop, except for any thin path between the vias. The small width associated with such a thin path would act like a resistor between the inside and outside areas of the ring or loop. Hence, if the inside of the loop is used to ground further connections, these further connections are not truly grounded.

In order to overcome such a potential problem, ground contacts 210 may also be provided along bisectional axis, through the outer portion of contacts, as illustrated in FIG. 2. These ground contacts on the outer portion 210 provide paths from the center of the integrated circuit package to the exterior of the integrated circuit package, and overcome the potential problem of a floating ground layer.

It is within the contemplation of the invention that further inner portion ground contact points can be used to further cement the ground plane and avoid any potential floating ground plane problem. The further inner portion ground contact points 230 are shown as hashed centers, as illustrated.

Figure 3:
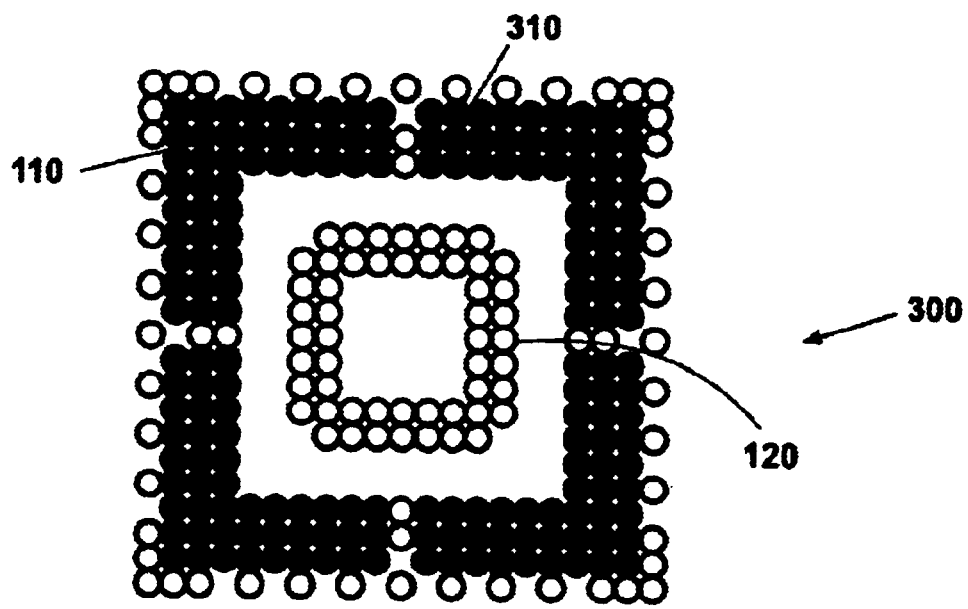
FIG. 3 shows an IC package contact layout illustrating positioning of contacts for data signals and other high speed signals, in accordance with the preferred embodiment of the present invention.

Referring now to FIG. 3, an IC package contact layout 300 illustrates positioning of contacts for data signals and other high-speed signals 310, in accordance with the preferred embodiment of the present invention. The preferred positioning of such contacts is illustrated as solid black circles on the outer portion of the IC package layout 300.

Again, the IC package layout of the preferred embodiment of the present invention includes an inner portion of contacts 120 and an outer portion of contacts 110. By positioning data and high speed signal contacts on the inner side of the outer portion, track design for the data signals and other high speed signals contacts 310 can readily make use of lower PCB layers, namely between the uppermost layer on which the integrated circuit package is mounted and any ground (typically the lowest) layer, if applicable. In this manner, data and high-speed signals can be easily routed away from the integrated circuit package 300.

Clearly, the IC designer and the printed circuit layout designer would benefit from implementing the inventive concepts described in respect of any one (or more) of the aforementioned contact configurations. The combination of all of the configurations is, however, particularly advantageous in addressing the various circuit layout/IC contact problems mentioned earlier.

In particular, a further advantage in incorporating a number of the configurations is that the layout of the contacts significantly reduces obstructions to track routing on the PCB. Such obstructions are generally caused by the relatively thick ground vias and power tracks. Hence, routing of the tracks for the data and high speed signal contacts, when using the power supply and/or ground contact configurations is made easier. This enables the circuit/PCB layout designer to generally use fewer PCB layers. This of course reduces the cost of the PCB significantly.

Also, the inventor of the present invention envisages that, in certain circumstances, the benefit resulting from implementing the present invention may apply when implementing only one contact in one or more configurations. However, it would be expected that the benefits of implementing the invention are greater when a majority of respective contacts in one or more configurations are used in the described manner.

It is envisaged that the present invention may be implemented in any type of integrated circuit package comprising an array of contacts, for example wire bonding or flip-chip type packaging. The contacts themselves may be in the form of pins, as used in pin grid array packaging, or balls, as used in ball grid array packaging.

It is within the contemplation of the invention that the number and general pattern of the contacts provided on the IC packaging may vary substantially from IC to IC, and the illustrated embodiments in FIGS. 1–3 are shown for explanatory purposes only. Furthermore, although the preferred embodiment of the invention relates to two distinct regions of contacts, an inner region and an outer region, it is envisaged that a skilled artisan could employ the inventive concepts herein described in many other topographies. For example, there may be no need (or space) to introduce two "distinct" regions separated by a gap, and the two regions may coincide or even overlap. Alternatively, three or more distinct regions may be prevalent. However, it is envisaged that the general theories behind the aforementioned inventive concepts can be applied to any IC package configuration.

Such topographies are dependent upon the shape and configuration of the IC to be incorporated onto the PCB and may, for example, comprise concentric circles, a substantially circular IC package layout, a substantially rectangular IC package layout, etc.

Although the inventive concept of the present invention has been described with respect to an IC package having many contact points, it is envisaged that the inventive concepts can be equally applied to other devices or components with a plurality of contact points, such as Programmable Gate Logic Arrays (PGLAs), Application Specific ICs (ASICs), etc. As such, it is envisaged that any electrical or electronic device comprising an integrated circuit package device would benefit from the inventive concepts described herein.

It will be understood that the various contact layout embodiments described above provide at least some of the following advantages:

(i) In arranging the power supply contacts in the extremity of the outer portion of contacts, the required de-coupling capacitors can be located as close to the power supply contacts as possible, thereby keeping the track length to a minimum.

(ii) By providing the ground contacts toward the center of the IC package, avoids the need for the other contacts to be routed around the ground contacts and their related vias.

(iii) Provision of the timing and/or frequency contacts on the extremity of the outer portion, together with the power supply contacts, allows the required clock generation components etc. to be positioned as close to the respective contacts as possible, whilst enabling all required tracking to be arranged on the uppermost layer (s).

(iv) Provision of the data and/or high speed signal contacts on the internal side of the outer portion, allows easier access to these ports, particularly when in conjunction with implementing the arrangements in (i)–(iii).

Whilst the specific and preferred implementations of the embodiments of the present invention are described above, it is clear that one skilled in the art could readily apply variations and modifications of such inventive concepts.

Thus, an improved integrated circuit and printed circuit board arrangement has been described wherein the aforementioned disadvantages associated with prior art arrangements have been substantially alleviated.

What is claimed is:

1. An integrated circuit package device having a plurality of contact points, wherein the plurality of contact points includes an inner portion of said contact points and an outer portion of said contact points, the integrated circuit package device comprising at least one of the following:

(i) a majority of power supply contacts configured substantially in an extremity of said outer portion;

(ii) a majority of timing or frequency contacts configured substantially in said outer portion; and (iii) a majority of data or high speed signal contacts configured substantially in an inner side of said outer portion.

2. The integrated circuit package device according to claim 1, wherein ground contacts are further provided along a bisectional axis through said outer portion to facilitate a ground path from outside an area of the integrated circuit package device to said inner portion.

3. The integrated circuit package device according to claim 1, wherein said inner portion is formed substantially of ground contact points to effect a ground plane.

4. The integrated circuit package device according to claim 1, wherein, for one or more signals associated with (i) to (iii), all of said respective contacts are configured in the respective manner described in one or more of (i) to (iii).

5. The integrated circuit package device according to claim 1 further comprising at least one ground contact configured substantially in said inner portion.

6. The integrated circuit package device according to claim 1 wherein the inner portion and the outer portion are two distinct regions separated by a space.

7. An integrated circuit package device according to claim 1 comprising two or more of the following:
  (i) a majority of power supply contacts configured substantially in an extremity of said outer portion;
  (ii) a majority of timing or frequency contacts configured substantially in said outer portion; and
  (iii) a majority of data or high speed signal contacts configured substantially in an inner side of said outer portion.

8. An integrated circuit package device according to claim 1 comprising all of the following:
  (i) a majority of power supply contacts configured substantially in an extremity of said outer portion;
  (ii) a majority of timing or frequency contacts configured substantially in said outer portion; and
  (iii) a majority of data or high speed signal contacts configured substantially in an inner side of said outer portion.

9. An integrated circuit package device according to claim 7 wherein the inner portion and the outer portion are two distinct regions separated by a space.

10. An integrated circuit package device according to claim 8 wherein the inner portion and the outer portion are two distinct regions separated by a space.

11. An integrated circuit package device according to claim 8 and further comprising a majority of ground contacts configured substantially in said inner portion.

12. An electrical or electronic device comprising the integrated circuit package device according to claim 7.

13. An electrical or electronic device comprising the integrated circuit package device according to claim 8.

14. An electrical or electronic device comprising the integrated circuit package device according to claim 9.

* * * * *